(12) United States Patent
Reisfeld

(10) Patent No.: US 6,564,859 B2
(45) Date of Patent: May 20, 2003

(54) EFFICIENT HEAT PUMPING FROM MOBILE PLATFORMS USING ON PLATFORM ASSEMBLED HEAT PIPE

(75) Inventor: Gideon Reisfeld, Zichron Yaakov (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/893,948

(22) Filed: Jun. 27, 2001

(65) Prior Publication Data

US 2003/0000681 A1 Jan. 2, 2003

(51) Int. Cl.[7] .............................................. F28D 15/00
(52) U.S. Cl. ............. 165/104.26; 165/185; 165/104.33; 165/78; 29/890.032; 361/700; 174/15.2
(58) Field of Search .................... 165/78, 80.4, 104.21, 165/104.26, 185; 361/700, 704; 174/15.2; 257/715, 716; 29/890.032

(56) References Cited

U.S. PATENT DOCUMENTS

| | | | | |
|---|---|---|---|---|
| 4,345,642 A | * | 8/1982 | Ernst et al. ............ 165/104.26 |
| 4,381,818 A | * | 5/1983 | Sachar et al. ................ 165/133 |
| 4,773,476 A | * | 9/1988 | Baehrle et al. ........ 165/104.26 |
| 5,148,861 A | * | 9/1992 | Colvin et al. .................. 165/78 |
| 5,314,010 A | * | 5/1994 | Sakaya et al. ......... 165/104.26 |
| 5,697,434 A | * | 12/1997 | Burward-Hoy ............. 165/185 |
| 5,946,191 A | * | 8/1999 | Oyamada .................... 361/700 |
| 6,097,599 A | * | 8/2000 | Jocham et al. ............ 165/80.5 |
| 6,111,751 A | * | 8/2000 | Sakuyama ................... 361/704 |
| 6,118,654 A | * | 9/2000 | Bhatia ........................ 361/700 |
| 6,181,553 B1 | * | 1/2001 | Cipolla et al. ............. 174/15.2 |
| 6,437,983 B1 | * | 8/2002 | Machiroutu et al. ........ 361/700 |

* cited by examiner

Primary Examiner—Henry Bennett
Assistant Examiner—Terrell McKinnon
(74) Attorney, Agent, or Firm—Blakely, Sokoloff, Taylor & Zafman LLP

(57) ABSTRACT

A heat exchanger system for mobile platforms is provided. In one embodiment, a heat conductive block is coupled with an integrated circuit package. A first proximal end of a first section of heat conductive tube is coupled to the metal block, and a free end of the first section of heat conductive tube is configured to sealably couple with a second free end of a corresponding second portion of heat conductive tube. Additionally, a first portion of a wick is disposed within the first section of heat conductive tube.

20 Claims, 2 Drawing Sheets

EFFICIENT HEAT PUMPING FROM MOBILE PLATFORMS USING ON PLATFORM ASSEMBLED HEAT PIPE

FIELD OF THE INVENTION

The present invention relates to integrated circuits, and more particularly to heat exchanger systems for integrated circuits.

BACKGROUND OF THE INVENTION

After a short period of use, the internal components of electronic devices such as computers become heated. As a result, system performance suffers and system reliability degrades. However, performance and reliability may be restored by cooling the electrical components to remove excess heat.

In general, heat may be transferred from one body to another simply by bringing a cool body into contact with a warm body because heat tends to flow from warmer areas to cooler areas. However, simply touching two bodies together rarely yields an efficient heat transfer because pockets of heat insulating air are often trapped between irregularities in the mating surfaces. The efficiency of a heat transfer between two bodies may be improved using a thermal interface material (TIM). Typically, TIM's are malleable materials that conduct heat well, such as metallic or polymeric materials, thermal greases, thermal gels, or thermal greases/gels filled with metallic particles.

In computer systems, a computer chip may be cooled by coupling it with a heat exchanger. Because of space and other constraints, it is often impractical to mate the chip and heat exchanger directly. Typically, the chip is bonded to a heat conductive metal block using a TIM. The metal block is then coupled with a remote heat sink via a heat pipe. In most cases, the heat pipe is soldered at one end to the metal block and at the other to the heat sink.

Heat pipes are known for having a small cross-sectional area and a low resistance to the transfer of thermal energy. Components of a heat pipe typically include a vacuum-sealed heat conductive tube containing a liquid and a porous metal wick. Often, the wick is which may be attached to an inner surface of the heat conductive tube. As the liquid inside the heat pipe vaporizes at the pipe's hot end and condenses at the pipe's cool end, heat is transferred from the metal block to the heat sink. Once condensed, the liquid flows via capillary action of the wick back to the hot end, and the circulation cycle continues as long as the metal block supplies heat and the temperature of the heat sink is low enough. Vacuum pressure inside the heat pipe ensures an efficient circulation cycle because liquids vaporize quickly at low pressures.

Generally speaking, heat is transferred more efficiently in desktop computer systems than in mobile computer systems. In desktop systems, the chip manufacturers bond the metal block to the chip using a high quality TIM. Whereas in mobile systems, original equipment manufacturers (OEM's) bond the block to the chip using a low quality TIM and an aggressive attachment method that challenges the reliability of the chip. Consequently, mobile platform heat exchangers tend to operate less efficiently than their desktop platform counterparts.

Thus, a solution is needed that increases the effectiveness of mobile platform heat exchanger systems.

BRIEF DESCRIPTION OF THE DRAWINGS

The present invention is illustrated by way of example and not limitation in the figures of the accompanying drawings, in which.

DETAILED DESCRIPTION

An apparatus and method for assembling an on platform heat exchanger system for mobile platforms is disclosed. In the following detailed description, numerous specific details are set forth in order to provide a thorough understanding of the present invention. However, it will be apparent to one of ordinary skill in the art that these specific details need not be used to practice the present invention. In other circumstances, well-known structures, materials, or processes have not been shown or described in detail in order not to unnecessarily obscure the present invention.

Figure 1:
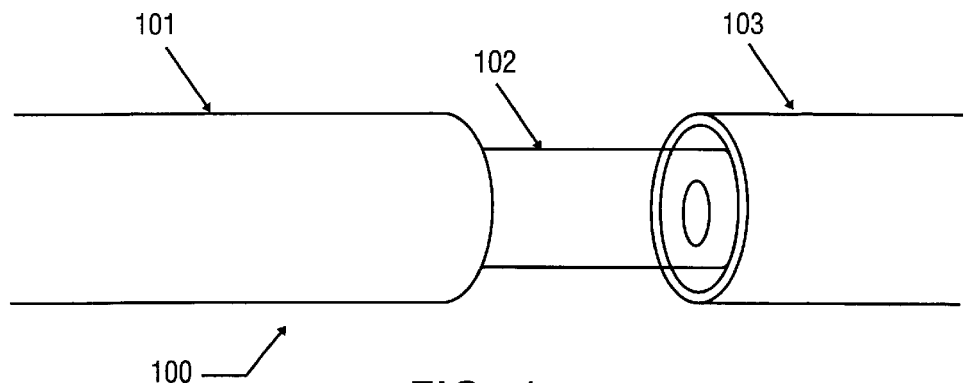
FIG. 1 illustrates the architecture of a heat pipe according to one embodiment of the invention.

Referring now to FIG. 1, one embodiment of a heat pipe 100 is shown. In contrast to the prior art, heat pipe 100 may include a porous metal wick 102 and two sections (100 and 103) of a heat conductive tube. When connected, the sections 100 and 103, together with wick 102, form a heat pipe. In one embodiment, the first section 100 of the heat conductive tube may be attached to a heat conductive block (not shown) by a chip manufacturer. Similarly, at a separate time, an OEM (or other party) may attach the second section 103 of the heat conductive tube to a heat sink (not shown).

Using soldering techniques common in the art, a heat pipe may be assembled by joining the first section 100 of the heat conductive tube to the second section 103 of the heat conductive tube. Because the chip manufacturer, not the OEM, bonds the metal block to the chip and to the first section 100 of the metal heat conductive tube, the reliability of the chip is preserved. Joining sections 100 and 103 together permits a more efficient transfer of heat than if an OEM bonded a metal block to the chip and then bonded a heat pipe to the metal block for two reasons. First, the chip manufacturer typically uses a higher quality TIM than the OEM. Second, the thermal conductivity of the metal heat conductive tube is typically higher than the thermal conductivity of the other components of the system. Thus, soldering the two halves together provides an thermally efficient way of coupling the metal block to a heat exchanger.

Sections 101 and 103 of the heat conductive tube may be formed of any material that efficiently conducts heat. For example, heat conductive sections 101 and 103 may be fashioned from metals such as copper, aluminum, and stainless steel, from heat conductive metal alloys, or from other heat conductive materials. In one embodiment, the wick 102 may be formed of a porous metal, such as aluminum.

Figure 2:
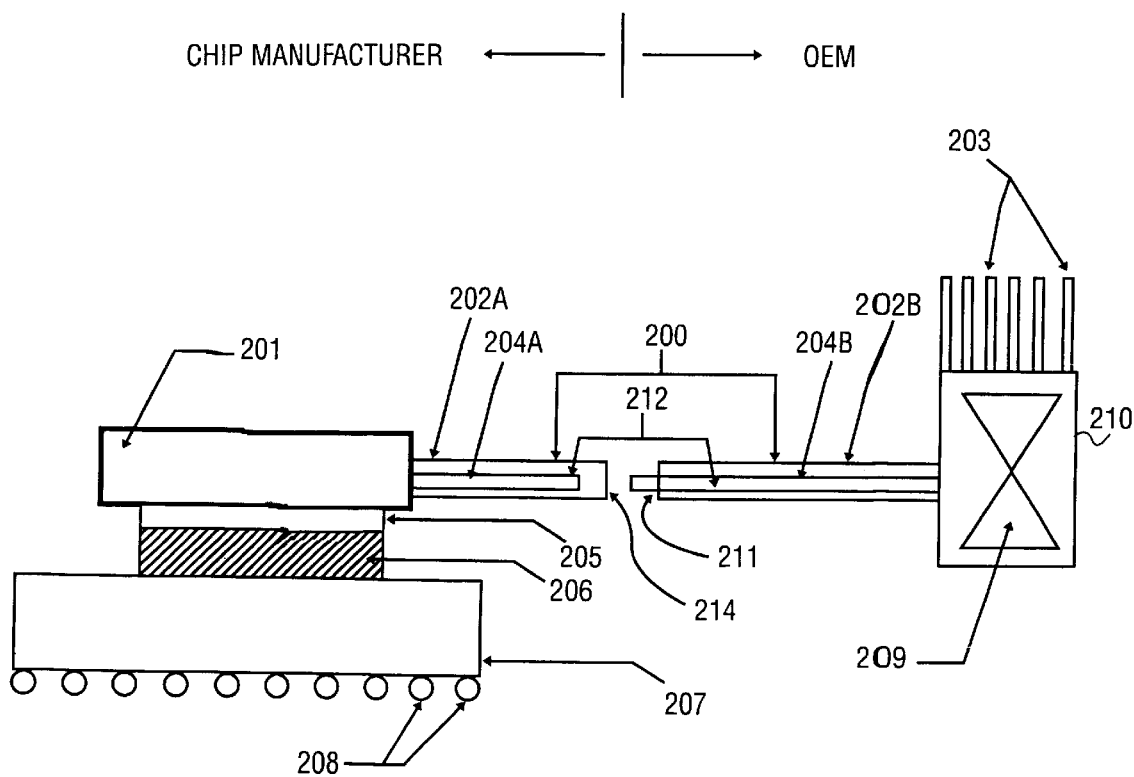
FIG. 2 illustrates a heat exchanger system according to one embodiment of the invention.

Referring now to FIG. 2, a diagram illustrating one embodiment of a mobile platform heat exchanger system is shown. In this embodiment, a first section 202a of a heat conductive tube 200 (e.g. a heat pipe) is attached to a metal block 201. The metal block 201 is shown bonded to a chip package 207 using a TIM 205 and silicon layer 206. A second section 202b of the heat conductive tube 200 is attached to a heat sink 210. In one embodiment, the heat sink 210 may include a radiator 203 and/or a fan 209. Section 202a of the heat conductive tube 200 may be attached to the metal block 201, and section 202b of the heat conductive tube 200 may be attached sink 210, using soldering materials, methods, and techniques known to those skilled in the art. In one embodiment, a first free end 210 of first section 202a of the heat conductive tube 200 is configured to sealably couple to a second free end 211 of second section 202b of the heat conductive tube 200.

Heat pipe 200 may be assembled using one of several methods. In one embodiment, a first portion 204a of wick 212 may be inserted in first section 202a of heat pipe 200. A second portion 204b of wick 212 may be inserted in and protrude from second section 202b of heat pipe 200. In this embodiment, first portion 204a of wick 212 has a length less than the length of the first section 202a of heat pipe 200 so that the length of the second portion 204b of wick 212 that protrudes from the second portion 202b of heat pipe 200 may fit within the first section 202a of heat pipe 200 when the two sections 202a and 202b of heat pipe 200 are joined together at ends 210 and 211, respectively. In one embodiment, wick 212 is adhered or affixed to the interior of heat pipe 200 using adhesion materials and techniques well known in the art.

Once connected at ends 210 and 211, sections 202a and 202b of heat pipe 200 may be sealably coupled using soldering processes, techniques, and materials known to persons skilled in the art. Additionally, a vacuum pressure may be created inside heat pipe 200 and a liquid, such as water, may be introduced and stored therein. A vacuum is created within heat pipe 200 because liquids tend to vaporize quickly at low pressures, and vaporization is crucial to an efficient heat transfer.

In a further embodiment, one or both of sections 202a and 202b of heat pipe 200 may include a small, pre-drilled injection port, which may be used to create a vacuum environment within heat pipe 200. A hollow needle coupled with a suction, injection, and capping machine may be removably inserted through the injection port into the heat pipe 200, and the interior of heat pipe 200 may be aspirated to create a vacuum therein. After a vacuum has been created, a liquid may be injected into the heat pipe 200 through the hollow needle. As the needle is withdrawn, a fast curing liquid metal sealant or other sealant may be injected into the injection port to seal the injection port and prevent the liquid from escaping. Alternatively, a soldering process may be used to seal the injection port. In an alternative embodiment, heat pipe 200 may be assembled within a vacuum chamber.

Figure 3:
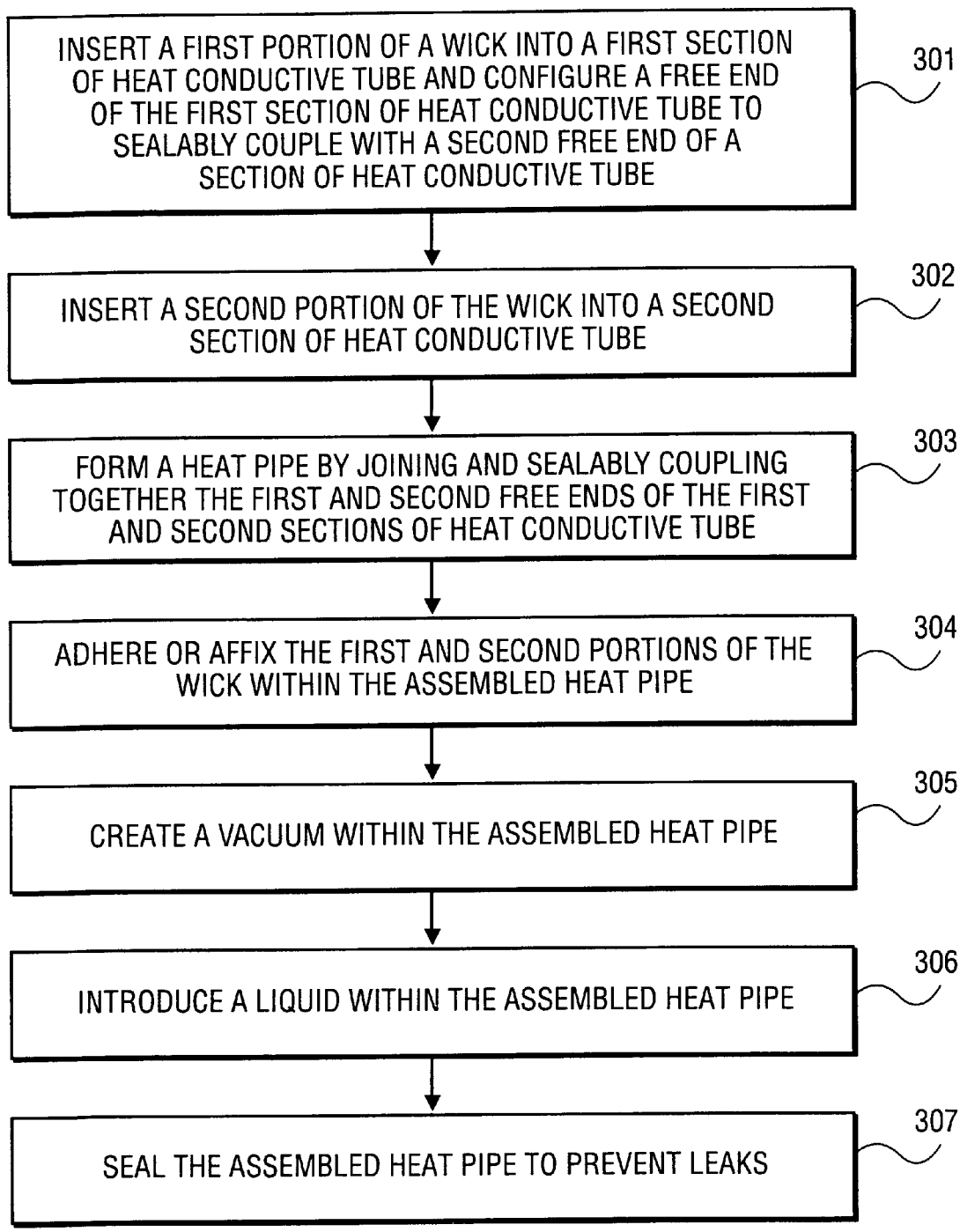
FIG. 3 illustrates a flowchart of one embodiment of a method useable with the present invention.

Referring now to FIG. 3, there is shown a flowchart illustrating one embodiment of a method used to assemble a heat pipe on a mobile platform. At Block 301, a first portion of a wick is inserted within a first section of a heat conductive tube such that the wick protrudes past a free end of the first section of heat conductive tube. A proximal end of the heat conductive tube may be attached to a metal block. In another embodiment, the proximal end may be attached to a heat sink.

At Block 302, a second portion of the wick is inserted within a second section of the heat conductive tube. The length of the second portion of the wick may be less than a length of the second section of the heat conductive tube. In one embodiment, a proximal end of the second section of heat conductive metal tube is attached to a metal block. In a further embodiment, the proximal end of the second section of heat conductive metal tube is attached to a heat sink. In yet another embodiment, both portions of the wick are adhered or affixed to the interior of their respective sections of the heat conductive tube. Additionally, the first and second sections of the heat conductive tube may each have a free end that is configured to sealably couple to the free end of the other section. In other words, a first free end of the first section of the heat conductive tube may be configured to sealably couple with a second free end of the second section of the heat conductive tube, and vice versa.

At Block 303, a heat pipe is formed by joining and sealably coupling the first and second free ends together. In the above embodiment, where two portions of a wick are used, a first portion of the wick protruding from a section of heat conductive tube may be inserted into the other section of heat conductive tube until the first portion of the wick touches or compresses against the other portion of the wick. In an embodiment, where only a single portion of wick used, the part of the wick protruding from a section of heat conductive tube may be inserted into the other section of heat conductive tube until a free end of the wick touches or compresses against a proximal end of the other section of heat conductive tube.

At Block 304, the wick may be adhered to the interior of the assembled heat pipe using heat-responsive adhesives. For example, portions of the wick may be coated with a heat-responsive adhesive before they are inserted within portions of a heat conductive tube. Once a heat pipe is assembled by joining the portions of heat conductive tube together, heat may be applied to the tube to activate the adhesive and bond the wick to the interior of the heat pipe.

At Block 305, a vacuum is created within the assembled heat pipe.

At Block 306, a liquid is introduced into the interior of the heat pipe.

At Block 307, the heat pipe is sealed to prevent leaks.

Although the present invention is described herein with reference to a specific preferred embodiment, many modifications and variations therein will readily occur to those with ordinary skill in the art. Accordingly, all such variations and modifications are included within the intended scope of the present invention as defined by the following claims.

What is claimed is:

1. A heat exchanger system for mobile platforms, comprising:

a heat conductive block coupled with an integrated circuit package;

a first section of heat conductive tube wherein a first proximal end of the first section of heat conductive tube is coupled to the metal block, a free end of the first section of heat conductive tube is configured to sealably couple with a second free end of a corresponding second portion of heat conductive tube;

a first portion of a wick disposed within the first section of heat conductive tube, wherein the first portion of the wick is shorter in length than the first section of the heat conductive tube; and a second portion of the wick disposed within the second section of heat conductive tube, wherein a free end of the second portion of the wick protrudes past the free end of the second section of heat conductive tube.

2. A heat exchanger system for mobile platforms according to claim 1, further comprising:

an adhesive to adhere the first portion of the wick inside the first section of heat conductive tube.

3. A heat exchanger system for mobile platforms according to claim 1 wherein the wick is made of a porous metal.

4. A heat exchanger system for mobile platforms according to claim 3 wherein the porous metal further comprises aluminum.

5. A heat exchanger system for mobile platforms according to claim 1 wherein the first section of heat conductive tube further comprises a material selected from the group consisting of aluminum, stainless steel, and alloys thereof.

6. A heat exchanger system for mobile platforms according to claim 1 wherein the metal block is soldered to the first proximal end of the first section of heat conductive tube.

7. A heat exchanger system for mobile platforms according to claim 1, further comprising:
   an injection port located in the first section of the heat conductive tube.

8. A heat exchanger system for mobile platforms, comprising:
   a first section of heat conductive tube wherein a first proximal end of the first section of heat conductive tube is coupled to a heat exchanger, wherein a free end of the first section of heat conductive tube is configured to sealably couple with a second free end of a corresponding second portion of heat conductive tube;
   a first portion of a wick disposed within the first section of heat conductive tube, wherein the first portion of the wick is shorter in length than the first section of the heat conductive tube; and
   a second portion of the wick disposed within the second section of heat conductive tube, wherein a free end of the second portion of the wick protrudes past the free end of the second section of heat conductive tube.

9. A heat exchanger system for mobile platforms according to claim 8, further comprising:
   an adhesive to adhere the first portion of the wick inside the first section of heat conductive tube.

10. A heat exchanger system for mobile platforms according to claim 8, wherein the wick is made of a porous metal.

11. A heat exchanger system for mobile platforms according to claim 10, wherein the porous metal further comprises aluminum.

12. A heat exchanger system for mobile platforms according to claim 8, wherein the first section of heat conductive tube further comprises a material selected from the group consisting of aluminum, stainless steel, and alloys thereof.

13. A heat exchanger system for mobile platforms according to claim 8, wherein the metal block is soldered to the first proximal end of the first section of heat conductive tube.

14. A heat exchanger system for mobile platforms according to claim 8, further comprising:
   an injection port located in the first section of the heat conductive tube.

15. A method, comprising:
   coupling a proximal end of a first section of heat conductive pipe with an object selected from the group consisting of a metal block and a heat exchanger;
   configuring a free end of the first section of heat conductive pipe to sealably couple with a second free end of a second section of heat conductive pipe
   disposing a first portion of a wick within an interior portion of the first section of heat conductive pipe, wherein the first portion of the wick is shorter in length than the first section of the heat conductive tube;
   disposing a second portion of the wick within a second portion of heat conductive tube, wherein a free end of the second portion of the wick protrudes past the free end of the second section of heat conductive tube.

16. A method according to claim 15, further comprising:
   forming a heat pipe by joining and sealably coupling the first free end of the first portion of heat conductive tube with a second free end of a second portion of heat conductive tube.

17. A method according to claim 15, further comprising:
   adhering the first and second portions of the wick within the corresponding first and second portions of heat conductive tube.

18. A method according to claim 16, further comprising:
   creating vacuum pressure within an interior of the assembled heat pipe.

19. A method according to claim 18, further comprising:
   introducing a liquid within the interior of the assembled heat pipe.

20. A method according to claim 19, further comprising:
   sealing the assembled heat pipe to prevent leaks.

* * * * *